(12) United States Patent
Liaw

(10) Patent No.: US 7,723,806 B2
(45) Date of Patent: May 25, 2010

(54) MEMORY CELLS AND SEMICONDUCTOR MEMORY DEVICE USING THE SAME

(75) Inventor: Jhon-Jhy Liaw, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 823 days.

(21) Appl. No.: 11/390,707

(22) Filed: Mar. 28, 2006

(65) Prior Publication Data

US 2007/0235765 A1 Oct. 11, 2007

(51) Int. Cl.
*H01L 29/76* (2006.01)
(52) U.S. Cl. .................. 257/401; 257/207; 257/208; 257/296; 257/311; 257/369; 365/200
(58) Field of Classification Search .................. 257/207, 257/208, 296, 311, 369, 401; 365/200
See application file for complete search history.

(56) References Cited

U.S. PATENT DOCUMENTS 6,922,354 B2 7/2005 Ishikura et al.

2004/0196705 A1* 10/2004 Ishikura et al. ............. 365/200
2006/0157788 A1* 7/2006 Joshi et al. .................. 257/351

FOREIGN PATENT DOCUMENTS

CN 1536674 10/2004

OTHER PUBLICATIONS

CN office action mailed Sep. 18, 2009.

* cited by examiner

*Primary Examiner*—Edward Wojciechowicz
(74) *Attorney, Agent, or Firm*—Thomas, Kayden, Horstemeyer & Risley

(57) ABSTRACT

Memory cells and semiconductor memory devices using the same. A substrate comprises two cross-coupled inverters and first and second pass-gate transistors formed therein, the inverters having a data storage node and a date bar storage node coupled to first terminals of the first and second pass-gate transistors. A first conductive layer is disposed on the substrate and comprises a bit line and a complementary bit line electrically connected to second terminals of the first and second pass-gate transistors respectively. A second conductive layer is disposed on the first conductive layer and comprises two first power lines covering the bit line and the complementary bit line respectively, wherein the first power lines, the bit line and the complementary bit line are parallel.

16 Claims, 17 Drawing Sheets

MEMORY CELLS AND SEMICONDUCTOR MEMORY DEVICE USING THE SAME

BACKGROUND

The present invention relates to semiconductor devices, and particularly to memory cells and semiconductor memory devices using the same.

Static random access memory (SRAM) integrated circuits have become popular in recent years with the advent of high speed and high density complementary metal-oxide-semiconductor (CMOS) technology. Complementary metal-oxide-semiconductor (CMOS) technology is the dominant technology currently in manufacture of ultra-large scale integrated (ULSI) circuits today. Size reduction of the semiconductor structures has provided significant improvements in speed, performance, circuit density and cost per unit function of semiconductor chips over the past few decades. Significant challenges, however, are faced as the size of CMOS devices continues to decrease.

For example, embedded SRAM is very important for high speed, low power, and system-on-chip products. In nanometer generation, each product may have several SRAM arrays on one chip. In order to improve layout efficiency and chip size and to increase chip speed, metal layer signal lines upon SRAM cell for data commutation and cross-array control lines are allowed, noise interference, however, may occur accordingly. Optimization of layout efficiency, speed, noise shielding and cell stability continues to be important. Thus, there is a need for an integrated circuit that allows signal lines through cell arrays, while providing optimum noise shielding.

SUMMARY

Embodiments of SRAM memory cells are disclosed, in which a substrate comprises two cross-coupled inverters and first and second pass-gate transistors formed thereon, the inverters having a data storage node and a date bar storage node coupled to first terminals of the first and second pass-gate transistors. A first conductive layer is disposed on the substrate and comprises a bit line and a complementary bit line electrically connected to second terminals of the first and second pass-gate transistors respectively. A second conductive layer is disposed on the first conductive layer and comprises two first power lines covering the bit line and the complementary bit line respectively, wherein the first power lines, the bit line and the complementary bit line are parallel.

In another embodiment of the invention, a first conductive layer is disposed on a substrate and comprises a bit line and a complementary bit line, and a second conductive layer is disposed on the first conductive layer and comprises two first power lines covering the bit line and complementary bit line respectively. The first power lines, the bit line and the complementary bit line are parallel.

In yet another embodiment of the invention, a substrate comprises a pass-gate transistor formed therein, a first conductive layer is disposed on the substrate and comprises a bit line electrically connected to a first terminal of the first pass-gate transistor, and a second conductive layer is disposed on the first conductive layer and comprises a first power line covering the bit line, wherein the first power line and the bit line are parallel.

Embodiments of a semiconductor memory device are also disclosed. The semiconductor device comprises a plurality of memory arrays each comprising a plurality of memory cells as disclosed, and at least one first well strapping cell electrically connected to the p-well regions in the memory cells.

BRIEF DESCRIPTION OF THE DRAWINGS

The invention will become more fully understood from the detailed description given hereinbelow and the accompanying drawings, given by way of illustration only and thus not intended to be limitative of the invention.

DESCRIPTION

It should be appreciated, that the invention provides many applicable inventive concepts that can be embodied in a wide variety of specific contexts. In particular, the method of the invention is described in the context of forming a 6T-SRAM and an 8T-SRAM. One of ordinary skill in the art, however, will appreciate that features of the invention described herein may be used for other types of device, such as other SRAM configurations and memory devices other than SRAMs. Accordingly, the specific embodiments discussed herein are merely illustrative, and do not limit the scope of the invention.

Figure 1:
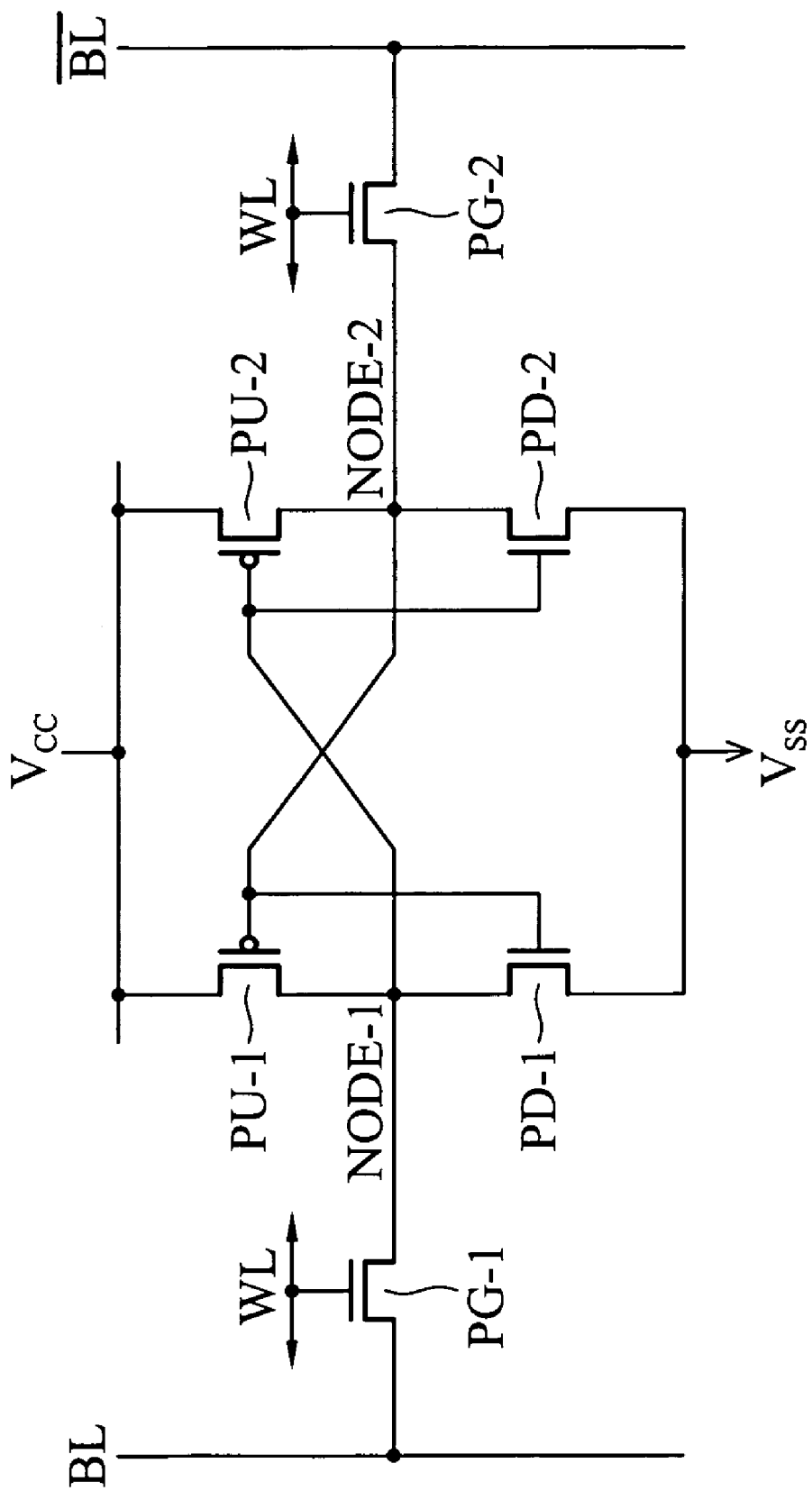
FIG. 1 is a schematic diagram of a 6T-SRAM cell.

Referring first to FIG. 1, a schematic diagram of a 6T-SRAM cell for reference, a 6T-SRAM cell comprises a first pass-gate transistor PG-1, a second pass-gate transistor PG-2, a first pull-up transistor PU-1, a second pull-up transistor PU-2, a first pull-down transistor PD-1, and a second pull-down transistor PD-2.

In operation, the memory cell forms two complementary nodes, node-1 and node-2. Because node-1 is tied to the gate of the second pull-up transistor PG-2 and node-2 is tied to the gate of the first pull-up transistor PG-1, the values stored in each node remain complementary to each other. For example, when node-1 is high, the PMOS second pull-up transistor PU-2 prevents current from $V_{cc}$ from flowing to node-2. In parallel, the gate of the NMOS second pull-down transistor PD-2 is activated, allowing any charge in node-2 to go to ground. Furthermore, when node-2 is low, the PMOS first pull-up transistor PU-1 allows current from $V_{cc}$ to node-1, and the gate of the NMOS first pull-down transistor PD-1 is de-activated, preventing the charge in node-1 from going to ground. The gates of the first pass-gate transistor PG-1 and the second pass-gate transistor PG-2 are electrically coupled to a word line WL to control data read from and written to the memory cell. Values stored in node-1 and node-2 are read on a bit-line BL and a complementary-bit-line /BL, respectively, both electrically coupled to a sense amplifier (not shown).

Figure 2A:
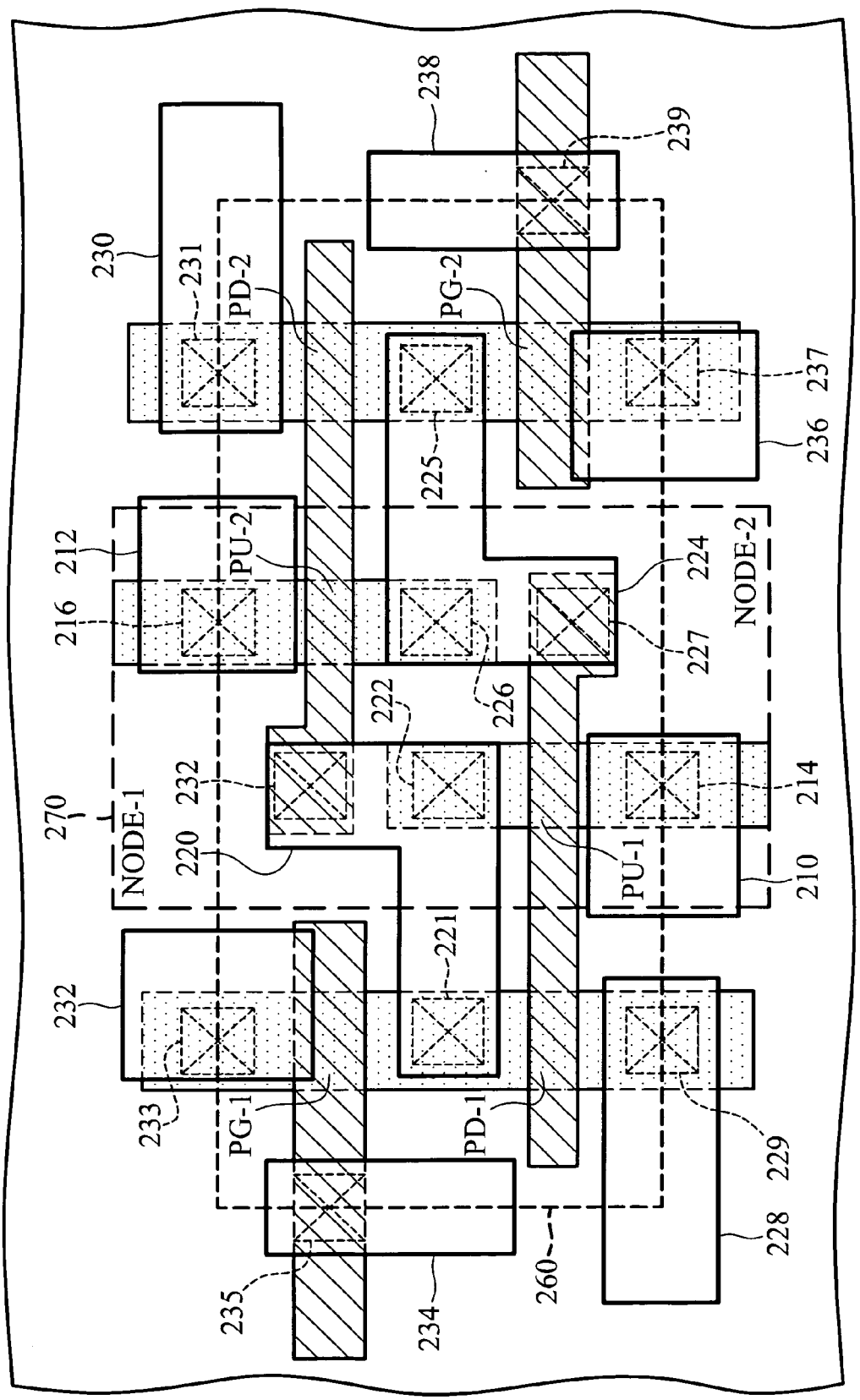
FIGS. 2A~2D are plan views of a layout of a 6T-SRAM cell in accordance with one embodiment of the invention.
Figure 2B:
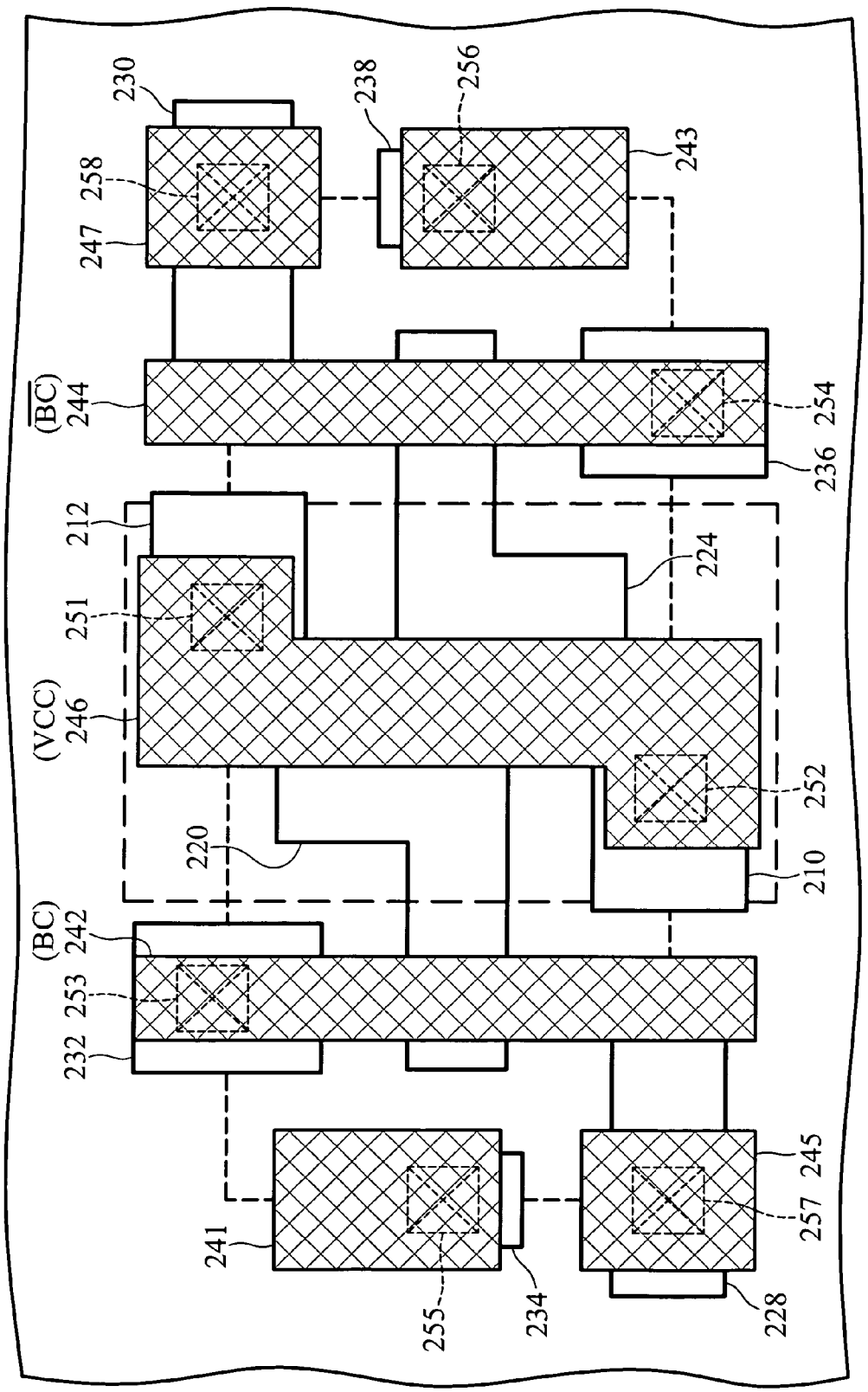
Figure 2C:
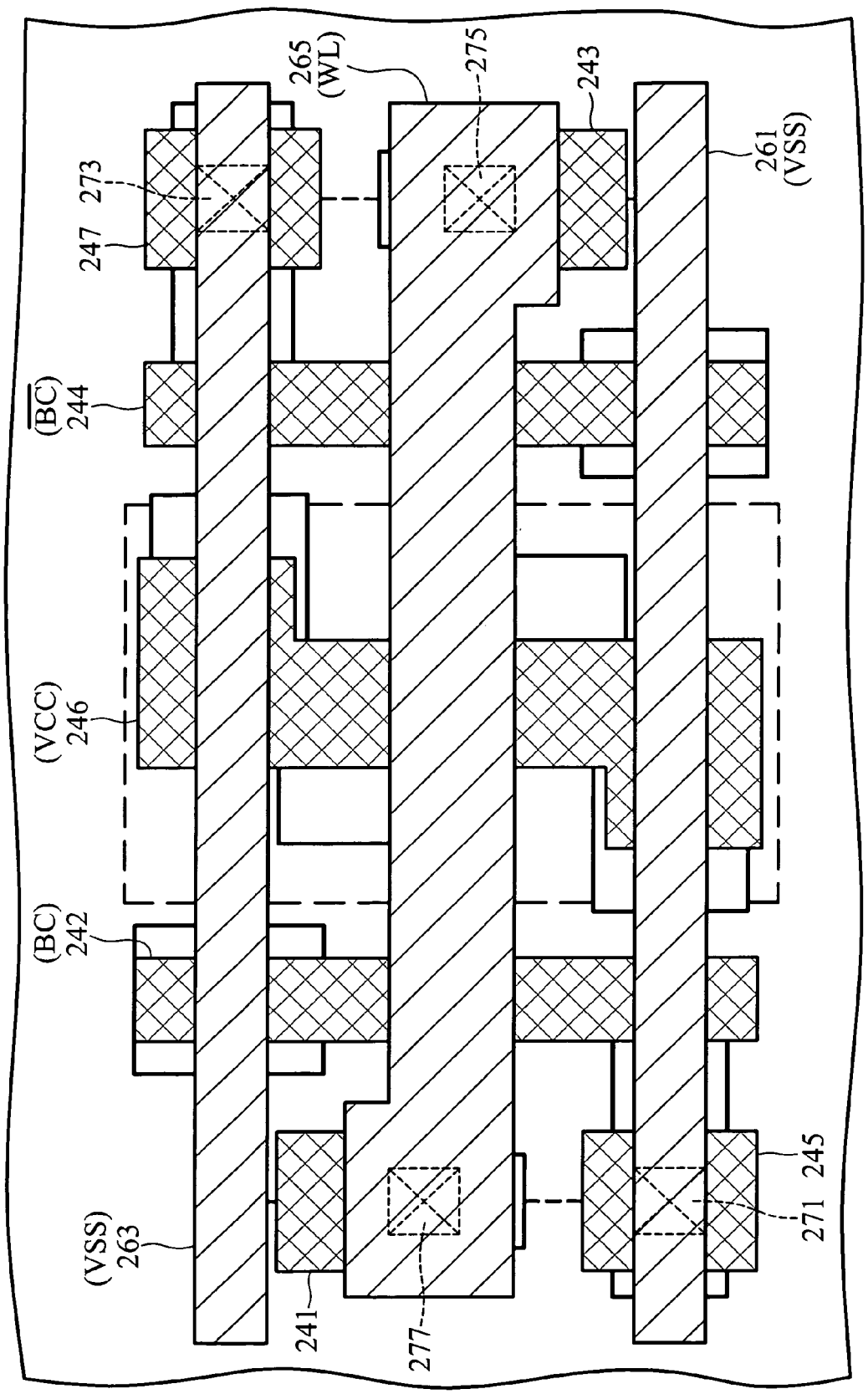
Figure 2D:
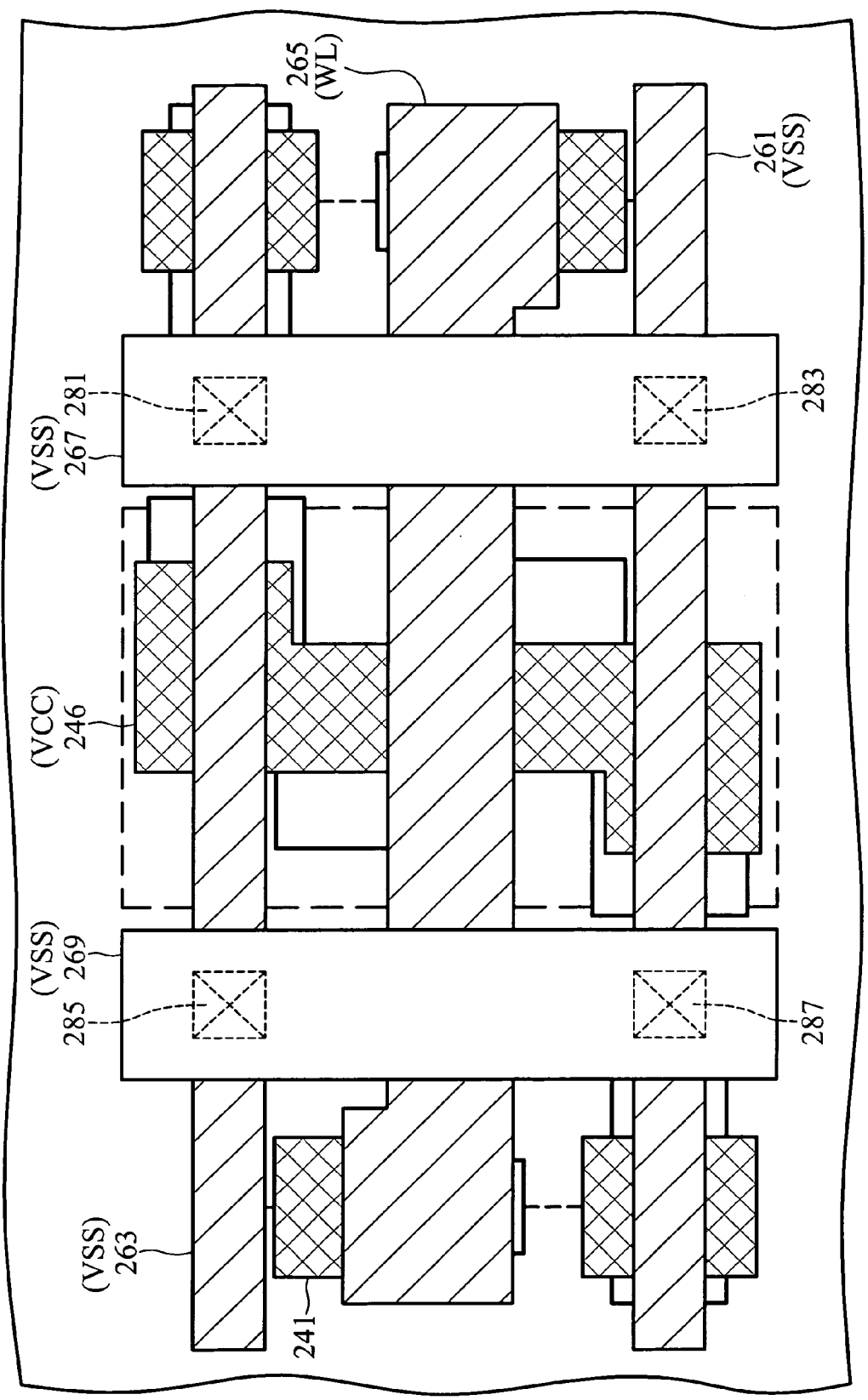

FIGS. 2A~2D are plan views of a layout of a 6T-SRAM cell in accordance with one embodiment of the invention. Specifically, FIG. 2A is a plan view combining the semiconductor device (active area and polysilicon) and the first metal layer (M1); FIG. 2B is a plan view comprising the first metal layer (M1) and the second metal layer (M2); FIG. 2C is a plan view comprising the second metal layer (M2) and the third metal layer (M3); and FIG. 2D is a plan view comprising the third metal layer (M3) and the fourth metal layer (M4).

As shown in FIG. 2A, the 6T-SRAM cell comprises a first pass-gate transistor PG-1, a second pass-gate transistor PG-2, a first pull-up-transistor PU-1, a second pull-up transistor PU-2, a first pull-down transistor. PD-1 and a second pull-down transistor PD2 formed on a substrate. For illustrative purposes, thick-linked rectangles with no fill indicate contact lines formed on the first metal line (M1). The substrate can be, for example, bulk Si, SiGe, strained-Si, SOI, non-bulk Si, or the like. The gate thicknesses of the transistors are preferably less than 1000 Å and may be of varying widths. The first and second pull-down transistors, however, preferably have a gate width of less than about 40 nm. The gate dielectric layer of the transistors may be a single or multiple layers, wherein at least one layer preferably comprises SiO2, nitrided oxide, nitrogen-containing oxide, SiON, a metal oxide, a high-K dielectric or a combination thereof. Further, is preferred that the gate oxide layer have a thickness less than 13 Å.

Preferably, the pull-up transistors PU-1 and PU-2 are PMOS transistors formed in an n-well 270 or a deep n-well, and the other transistors are NMOS transistors. The source terminals of the pull-up transistors PU-1 and PU-2 are electrically coupled to a voltage source VCC contact lines 210 and 212, respectively, located on the first metal layer (M1), via the plugs 214 and 216.

The drain terminals of the pull-up transistor PU-1, the pull-down transistor PD-1 and the pass-gate transistor PG-1 and the gate terminals of the pull-up transistor PU-2 and the pull-down transistor PD-2 are electrically coupled via intra-cell connection 220 on the first metal layer (M1) and plugs 221, 222 and 223. Similarly, the drain terminals of the pull-up transistor PU-2, the pull-down transistor PD-2 and the pass-gate transistor PG-2 and the gate terminals of the pull-up transistor PU-1 and the pull-down transistor PD-1 are electrically coupled via an intra-cell connection 224 on first metal layer (M1) and plugs 225, 226 and 227.

The source terminal of the pull-down transistor PD-1 is electrically coupled to ground VSS via VSS contact line 228 and plug 229, and the source terminal of the pull-down transistor PD-2 is electrically coupled to ground VSS via VSS contact line 230 and plug 231.

The source terminal of the pass-gate transistor PG-1 is electrically coupled to the bit line (not shown in FIG. 2A) via a BL contact line 232 and plug 233. The pass-gate transistor PG-1 electrically couples the bit line (BL) to the drain terminals of the pull-up transistor PU-1 and the pull-down transistor PD-1. The gate terminal of the pass-gate transistor PG-1 is electrically coupled to a word line WL (not shown in FIG. 2A) via contact line 234 on the first metal layer (M1) and plug 235.

The source terminal of the pass-gate transistor PG-2 is electrically coupled to the complementary bit line (/BL not shown in FIG. 2A) via contact line 236 and plug 237. Similarly, the pass-gate transistor PG-2 electrically couples the complementary bit line (BLB not shown in FIG. 2A) to the drain terminals of the pull-up transistor PU-2 and the pull-down transistor PD-2. The gate terminal of the pass-gate transistor PG-2 is electrically coupled to the word line (WL) via contact line 238 on the first metal layer (M1) and plug 239. One of ordinary skill in the art will appreciate that the above structure defines a unit or memory cell 260, as illustrated by the dotted line. The unit cell 260 defines the basic building block for designing memory cells and may be duplicated to create larger memories. The longer side of the memory cell 260 is preferably about 2 twice as long or more the shorter side of the memory cell 260. Moreover, it is preferred that the length of the shorter side of the unit cell 260 be about 0.485 um or shorter. The transistors are aligned such that the longitudinal axis of the source/drain regions are parallel to the shorter side of the memory cell 260.

An n-well 270, or a deep n-well, is formed within the memory cell 260. Preferably, the substrate is a p-type substrate, providing a large p-well substantially encircling the n-well 270, on which NMOS devices may be formed. The n-well 270 is formed on the substrate by performing an implant with n-type ions as is known in the art, allowing PMOS devices to be formed therein, such as the first pull-up transistor PU-1 and the second pull-up transistor PU-2.

FIG. 2B is a plan view comprising metal layers M1 and M2 that may be used in conjunction with the memory cell layout illustrated in FIG. 2A. Second metal layer M2 comprises a bit line (BL) 242, a complementary bit line (/BL) 244, a VCC line 246, contact lines 241, 243, 245 and 247. In this embodiment, the VCC line 246 is parallel to the bit line 242 and the complementary bit line 244, and is positioned therebetween.

The bit line 242 is electrically coupled to the contact line 232 on the first metal layer (M1) via a plug 253, and the contact line 232 on M1 is electrically coupled to the source terminal of the pass-gate transistor PG-1. The bit line 244 is electrically coupled to the contact line 236 on the first metal layer (M1) via a plug 254, and the contact line 236 on M1 is electrically coupled to the source terminal of the pass-gate transistor PG-2. The VCC line 246 is electrically coupled to the contact lines 210 and 212 on the first metal layer (M1) via plugs 251 and 252, and the contact lines 210 and 212 on M1 are electrically coupled to the source terminals of the pull-up transistors PU-1 and PU-2 respectively.

The contact lines 241 and 243 are electrically coupled to the contact lines 234 and 238 on the first metal layer (M1) via plugs 255 and 256, and the contact lines 234 and 238 on M1 are electrically coupled to the gate terminals of the pass-gate transistors PG-1 and PG-2 respectively. The contact lines 245 and 247 are electrically coupled to the contact lines 228 and 230 on the first metal layer (M1) via plugs 257 and 258, and the contact lines 228 and 230 on M1 are electrically coupled to the source terminals of the pull-down transistors PD-1 and PD-2 respectively.

FIG. 2C is a plan view comprising metal layers M1, M2 and M3 that may be used in conjunction with the memory cell layout illustrated in FIG. 2B. Third metal layer M3 comprises two VSS lines 261 and 263 and a word line (WL) 265. The VSS lines 261 and 263 are electrically coupled to the contact lines 245 and 247 on the second metal layer (M2) via plugs 261 and 263 respectively. The word line 265 is electrically coupled to the contact lines 241 and 243 on the second metal layer (M2) via plugs 275 and 277. In this embodiment, the word line 265 is parallel to the VSS lines 261 and 263, and is positioned therebetween. Further, the word line 265 and the VSS lines 261 and 263 are perpendicular to the bit line (BL) 242, the complementary bit line (/BL) 244 and the VCC line 246 on the second metal layer (M2).

FIG. 2D is a plan view comprising metal layers M1-M4 that may be used to in conjunction with the memory cell layout illustrated in FIG. 2C. Fourth metal layer M4 comprises two VSS lines 267 and 269. The VSS lines 267 and 269 are perpendicular to the VSS lines 261 and 263 and the word line 265 on the third metal layer (M3). The VSS lines 261 and 263 are electrically coupled to the VSS lines 261 and 263 on the third metal layer (M3) via plugs 281, 283, 285 and 287, to form a power grid. The bit line (BL) 242 and the complementary bit line (/BL) 244 on the second metal layer (M2) are fully covered by the VSS lines 269 and 267 on the fourth metal layer (M4) respectively.

Figure 2E:
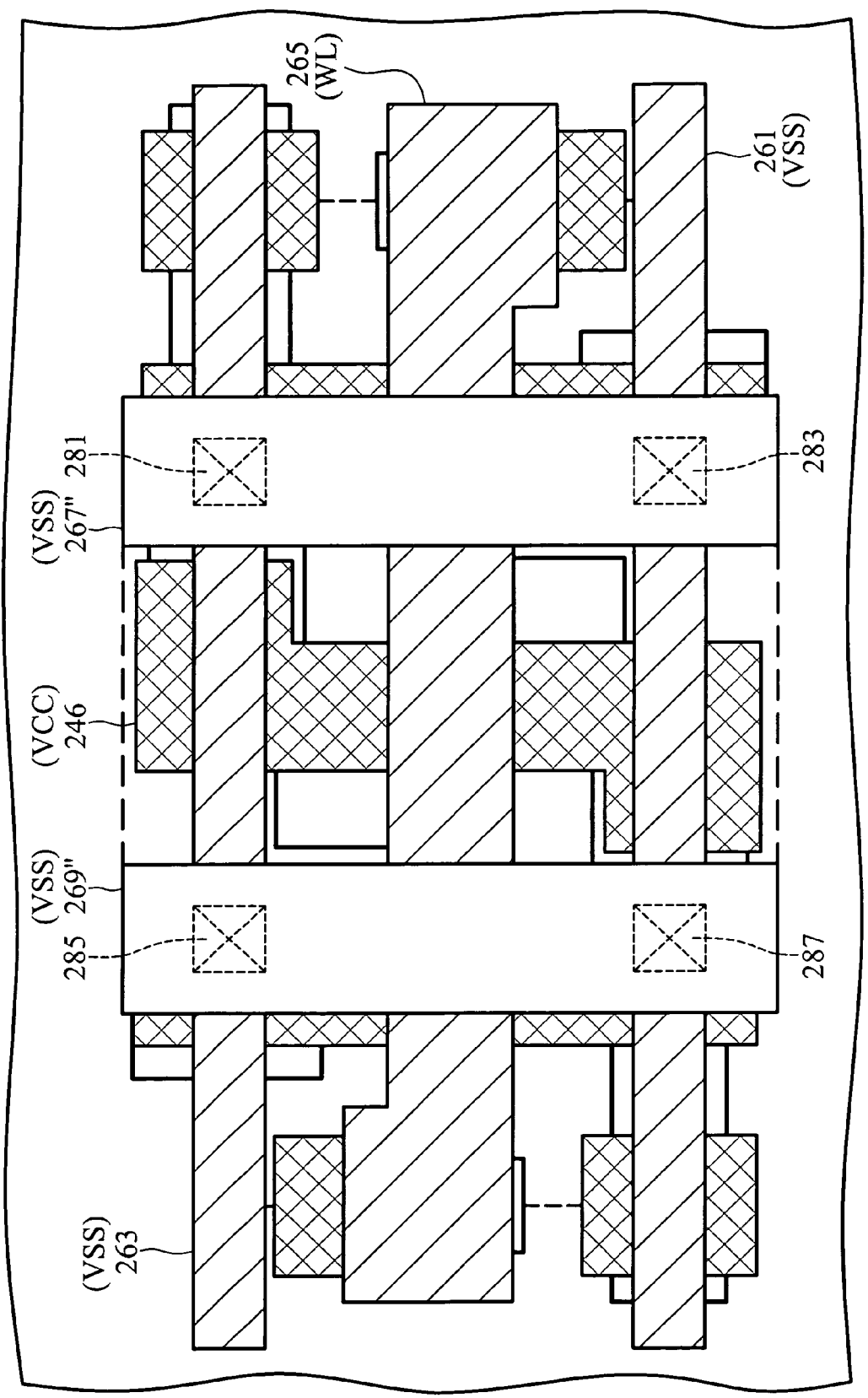
FIG. 2E shows another embodiment of memory cell of the invention.

FIG. 2E shows another embodiment of a memory cell of the invention. As shown, the bit line (BL) 242 and the complementary bit line (/BL) 244 on the second metal layer (M2) can also be partially covered by the VSS lines 269" and 267" on the fourth metal layer (M4) respectively.

Figure 3A:
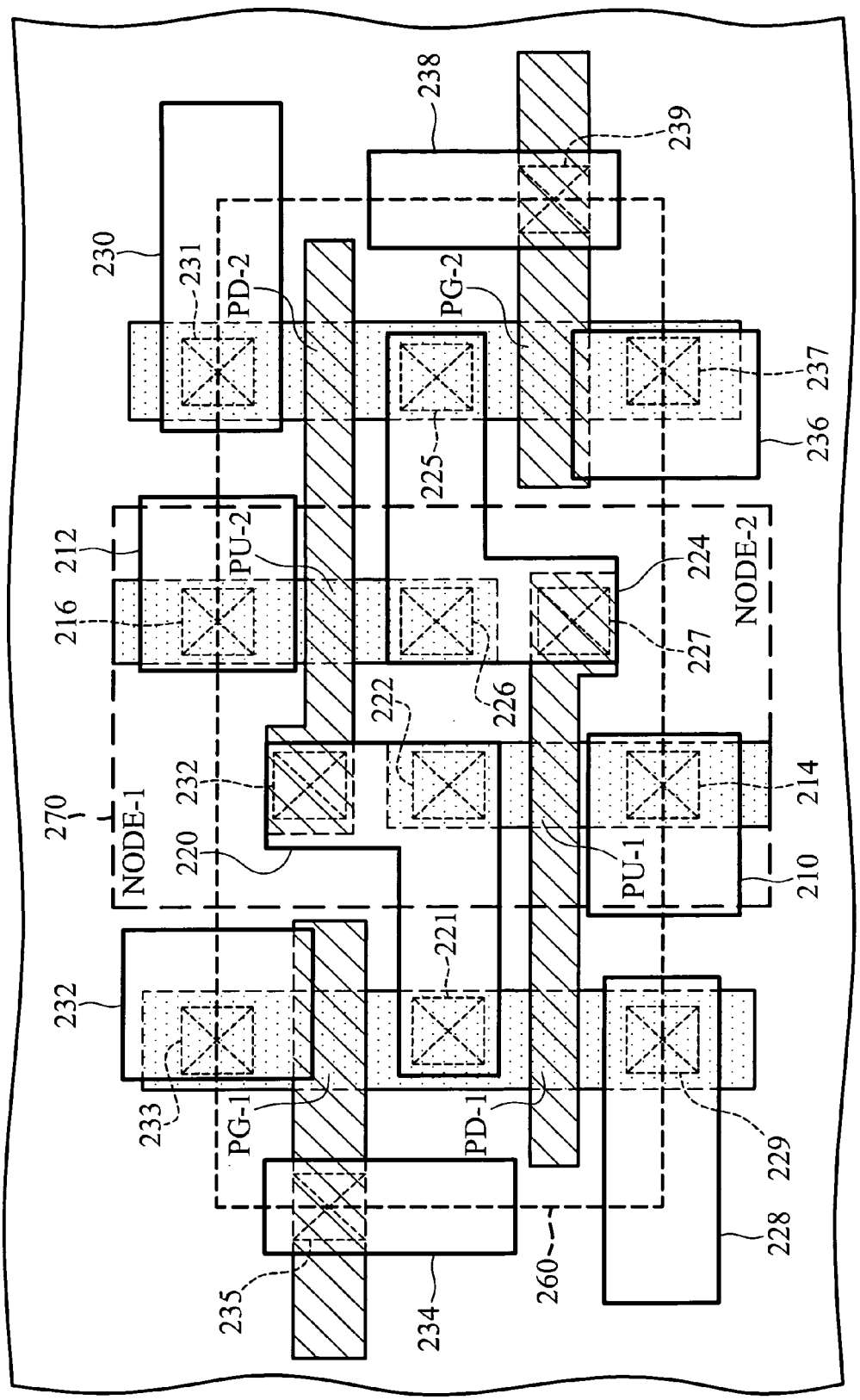
FIGS. 3A~3E are plan views of a layout of a 6T-SRAM cell in accordance with another embodiment of the invention.
Figure 3B:
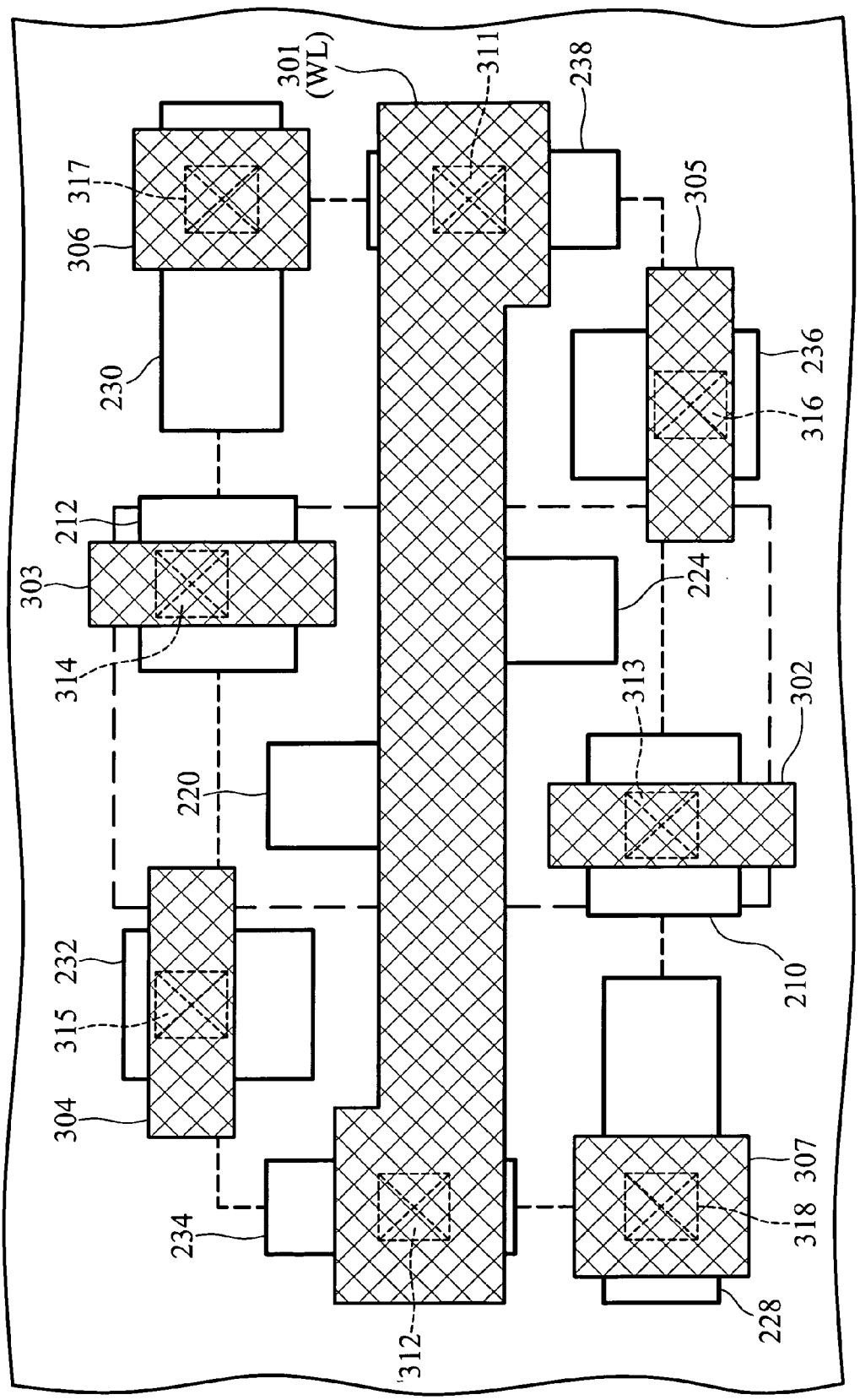

FIGS. 3A~3D are plan views of a layout of a 6T-SRAM cell in accordance with another embodiment of the invention. Specifically, FIG. 3A is a plan view combining the semiconductor device (active area and polysilicon) and the first metal layer (M1); FIG. 3B is a plan view comprising the first metal layer (M1) and the second metal layer (M2); FIG. 2C is a plan view comprising the second metal layer (M2) and the third metal layer (M3); and FIG. 2D is a plan view comprising the third metal layer (M3) and the fourth metal layer (M4).

As shown in FIG. 3A, the structure is similar to that in FIG. 2A, and thus, description thereof is omitted herefrom for simplification.

As shown in FIG. 3B, the second metal layer M2 comprises a word line 301 and contact lines 302-307. The world line 301 is electrically coupled to the contact lines 234 and 238 on the first metal layer (M1) via plugs 312 and 311 respectively, and the contact lines 234 and 238 on M1 are electrically coupled to the gate terminals of the pass-gate transistors PG-1 and PG-2.

The bit line 244 is electrically coupled to the contact line 236 on the first metal layer (M1) via a plug 254, and the contact line 236 on M1 is electrically coupled to the source terminal of the pass-gate transistor PG-2. The VCC line 246 is electrically coupled to the contact lines 210 and 212 on the first metal layer (M1) via plugs 251 and 252, and the contact lines 210 and 212 on M1 are electrically coupled to the source terminals of the pull-up transistors PU-1 and PU-2 respectively.

The contact lines 302 and 303 are electrically coupled to the contact lines 210 and 212 on the first metal layer (M1) via plugs 313 and 314, and the contact lines 210 and 212 on M1 are electrically coupled to the source terminals of the pull-up transistors PU-1 and PU-2 respectively. The contact lines 304 and 305 are electrically coupled to the contact lines 232 and 236 on the first metal layer (M1) via plugs 315 and 316, and the contact lines 232 and 236 on M1 are electrically coupled to the source terminals of the pass-gate transistors PG-1 and PG-2 respectively. The contact lines 306 and 307 are electrically coupled to the contact lines 228 and 230 on the first metal layer (M1) via plugs 317 and 318, and the contact lines 228 and 230 on M1 are electrically coupled to the source terminals of the pull-down transistors PD-1 and PD-2 respectively.

Figure 3C:
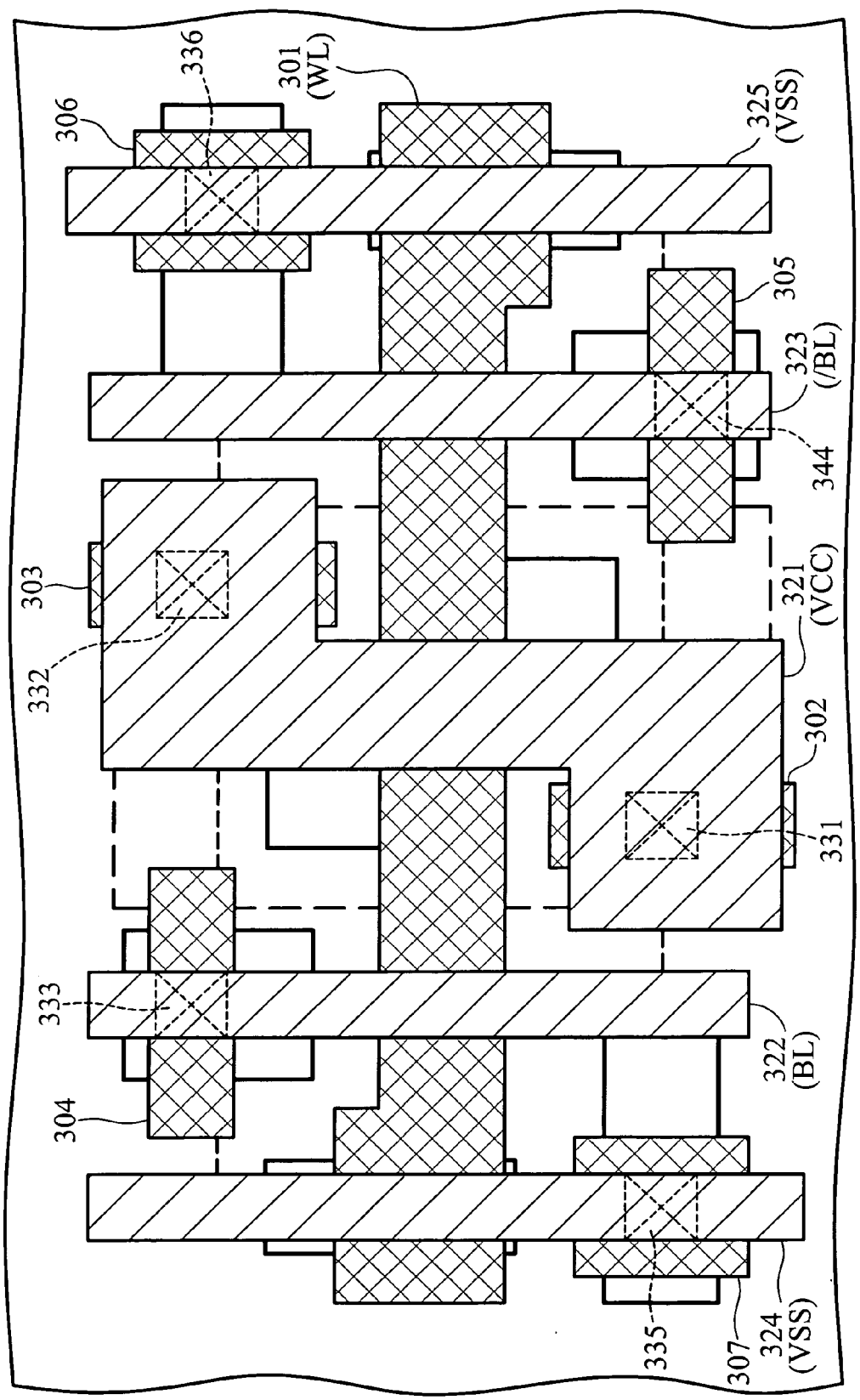

FIG. 3C is a plan view comprising metal layers M1, M2 and M3 that may be used in conjunction with the memory cell layout illustrated in FIG. 3B. The third metal layer M3 comprises a VCC line 321, a bit line (BL) 322, a complementary bit line (/BL) 323, and two VSS lines 324 and 325 arranged in parallel. In this embodiment, the VCC line 321, the bit line (BL) 322 and the complementary bit line (/BL) 323 are positioned between the two VSS lines 324 and 325, and the VCC line 321 is positioned between the bit line (BL) 322 and the complementary bit line (/BL) 323.

The VCC line 321 is electrically coupled to the contact lines 302 and 303 on the second metal layer (M2) via plugs 331 and 332 respectively. The bit line (BL) 322 is electrically coupled to the contact line 304 on the second metal layer (M2) via a plug 333. The complementary bit line (/BL) 323 is electrically coupled to the contact line 305 on the second metal layer (M2) via a plug 334. The VSS lines 324 and 325 are electrically coupled to the contact lines 307 and 306 on the second metal layer (M2) via plugs 335 and 336 respectively.

In this embodiment, the VCC line 321, the bit line (BL) 322, the complementary bit line (/BL) 323, and the two VSS lines 324 and 325 are perpendicular to the word line 301 on the second metal layer (M2).

Figure 3D:
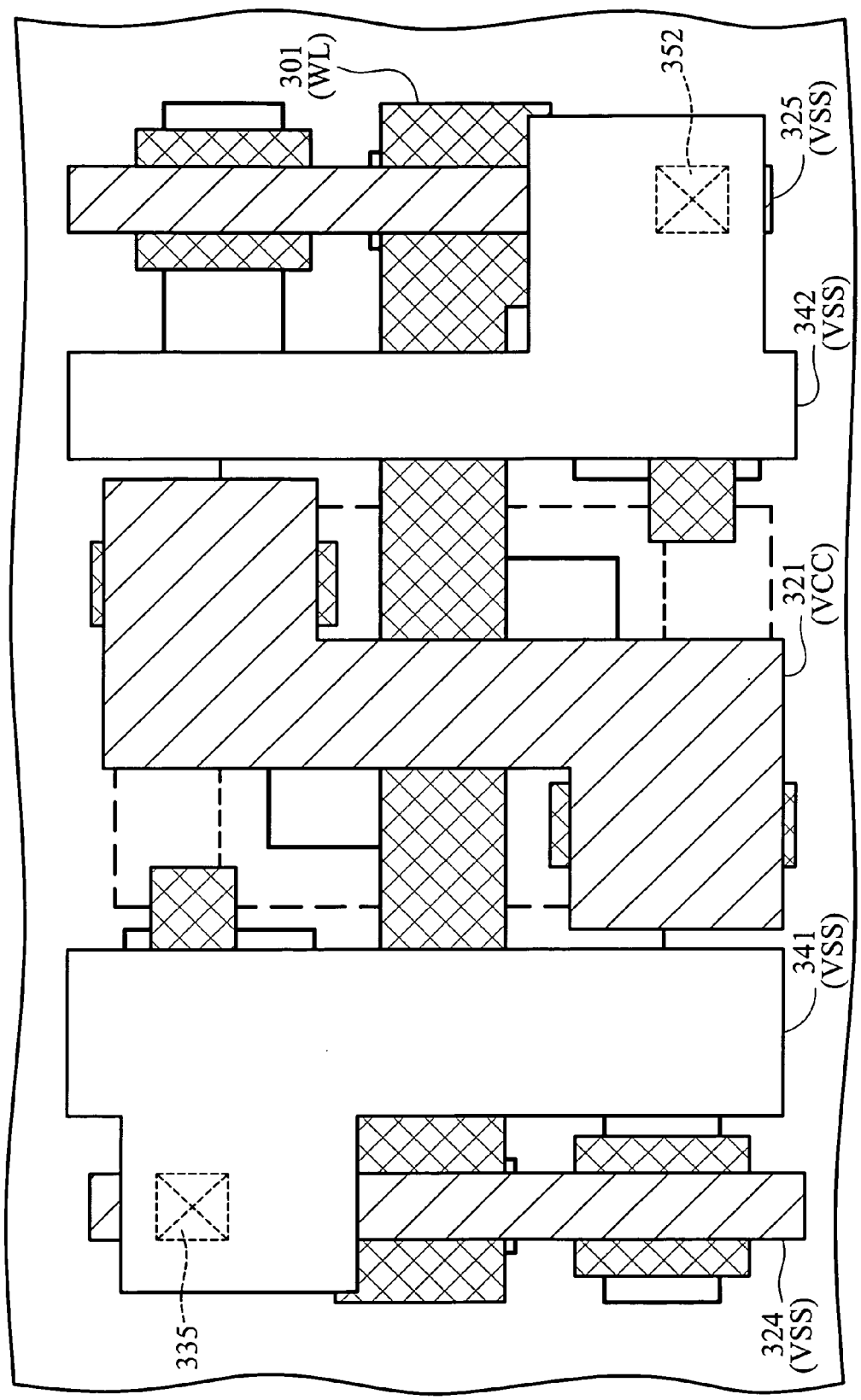

FIG. 3D is a plan view comprising metal layers M1-M4 that may be used in conjunction with the memory cell layout illustrated in FIG. 3C. The fourth metal layer M4 comprises two VSS lines 341 and 342. The VSS lines 341 and 342 are perpendicular to the VCC line 321, the bit line (BL) 322, the complementary bit line (/BL) 323, and the two VSS lines 324 and 325 on the third metal layer (M3). The VSS lines 341 and 342 are electrically coupled to the VSS lines 324 and 325 on the third metal layer (M3) via plugs 351 and 352. The bit line (BL) 322 and the complementary bit line (/BL) 323 on the third metal layer (M3) is fully covered by the VSS lines 341 and 342 on the fourth metal layer (M4) respectively.

Figure 3E:
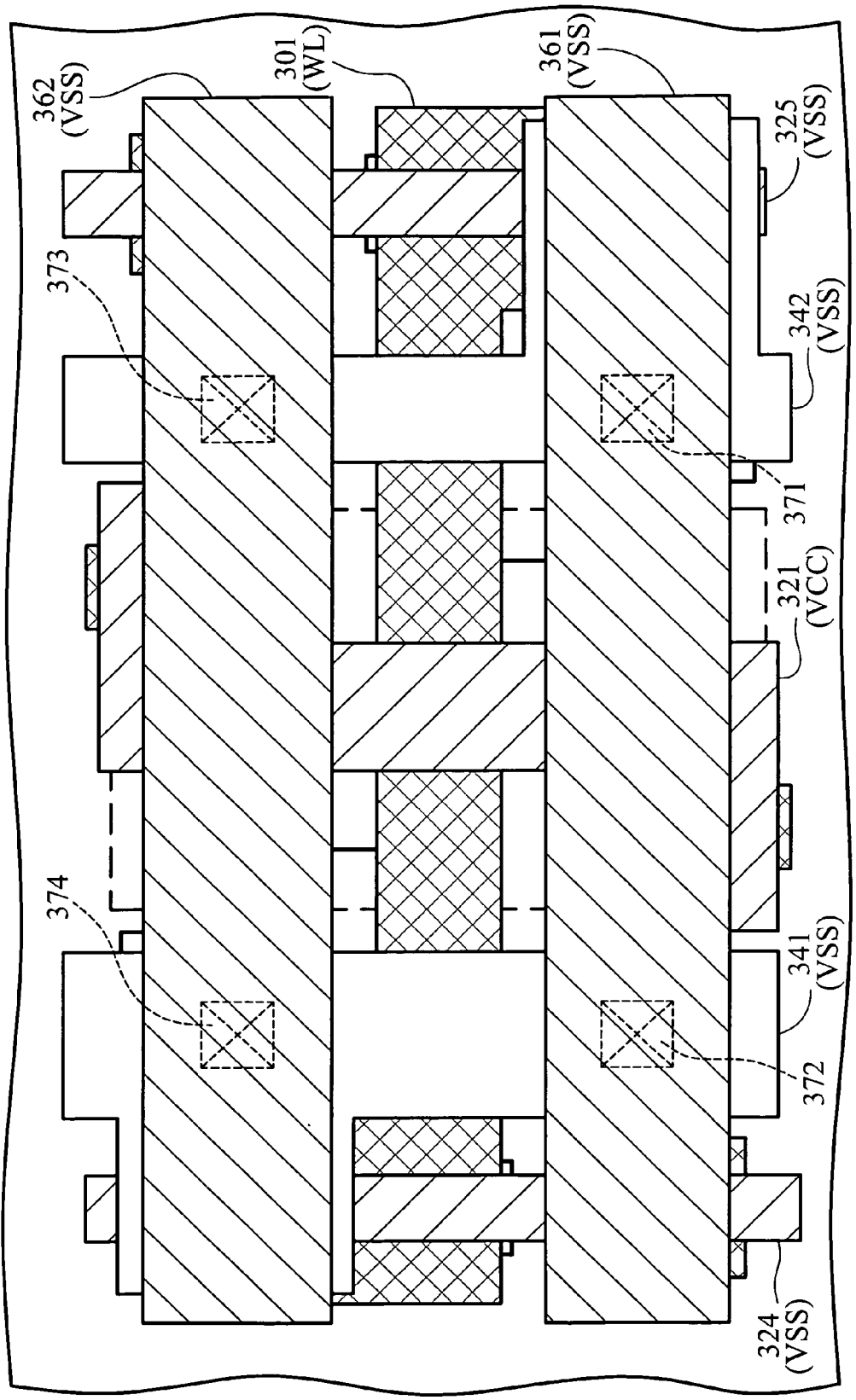

FIG. 3E is a plan view comprising metal layers M1-M5 that may be used in conjunction with the memory cell layout illustrated in FIG. 3D. The fifth metal layer M5 comprises two VSS lines 361 and 362. The VSS lines 361 and 362 are perpendicular to the VCC line 321, the bit line (BL) 322, the complementary bit line (/BL) 323, and the two VSS lines 324 and 325 on the third metal layer (M3) and the VSS lines 341 and 342 on the fourth metal layer (M4). The VSS lines 361 and 362 are electrically coupled to the VSS lines 341 and 342 on the fourth metal layer (M4) via plugs 371-374 to from a power grid.

Figure 3F:
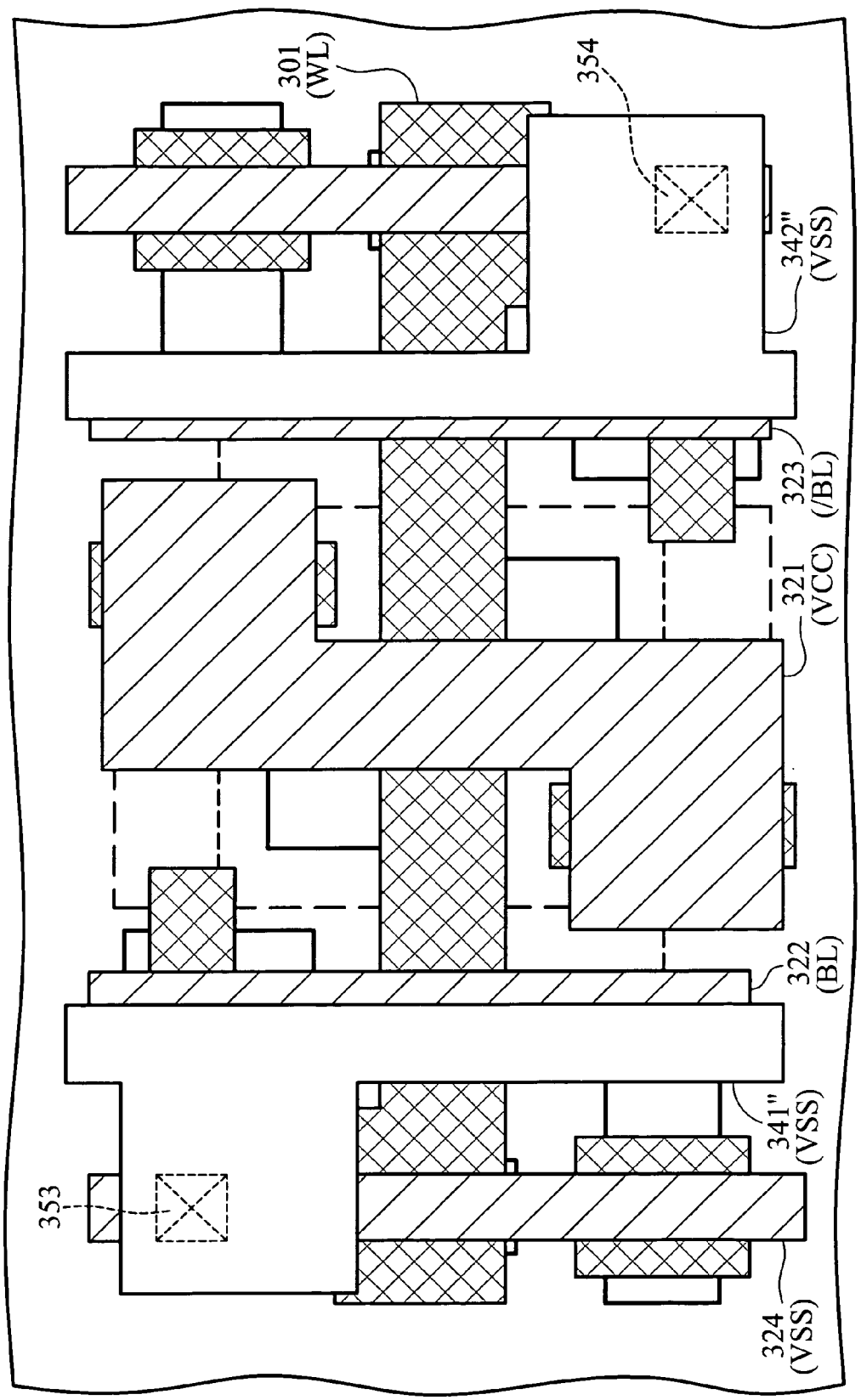
FIG. 3F shows another embodiment of memory cell of the invention.

FIG. 3F shows another embodiment of a memory cell of the invention. As shown, the bit line (BL) 322 and the complementary bit line (/BL) 323 on the third metal layer (M3) can also be partially covered by the VSS lines 341" and 342" on the fourth metal layer (M4) respectively.

Figure 4:
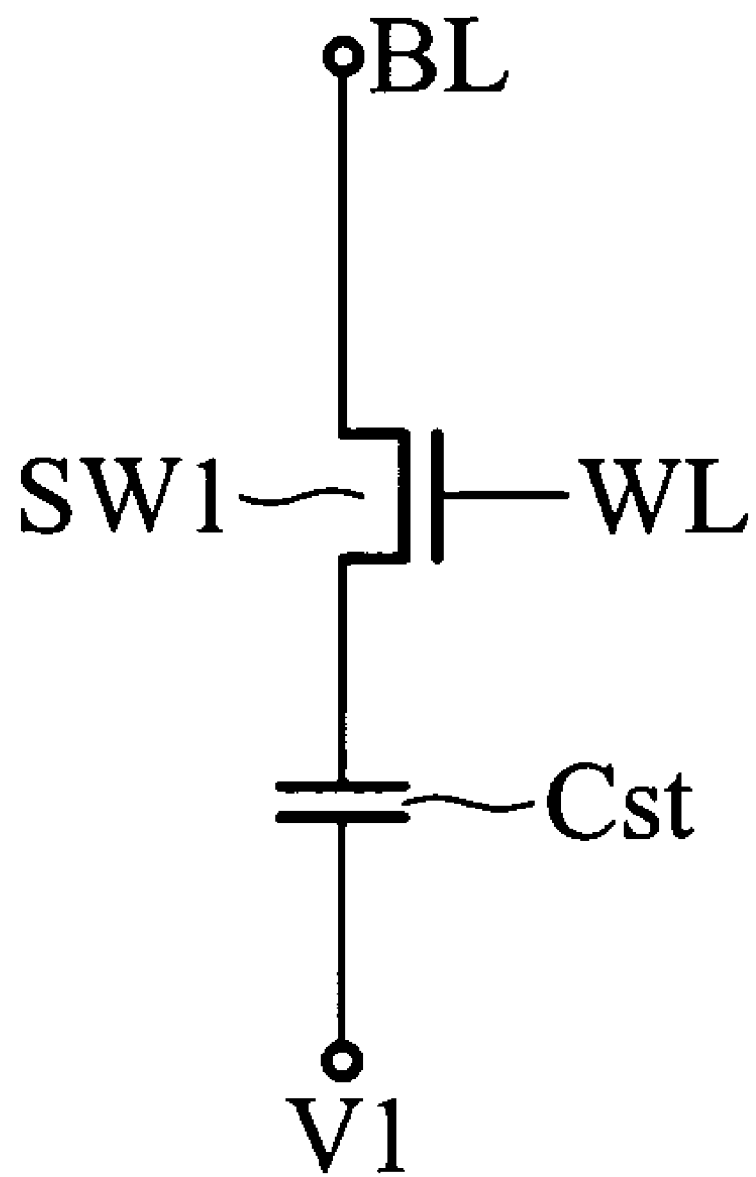
FIG. 4 is a schematic diagram of a DRAM cell.

FIG. 4 is a schematic diagram of a DRAM cell comprising a switching transistor SW1 and a storage capacitor Cst, in which the storage capacitor Cst has one terminal coupled to a fixed voltage V1, such as Vss or ground. The gate of the switching transistor SW1 is electrically coupled to a word line WL to control data read from and written to the memory cell. Values stored in storage capacitor Cst are read on a bit-line BL, electrically coupled to a sense amplifier (not shown).

Figure 5A:
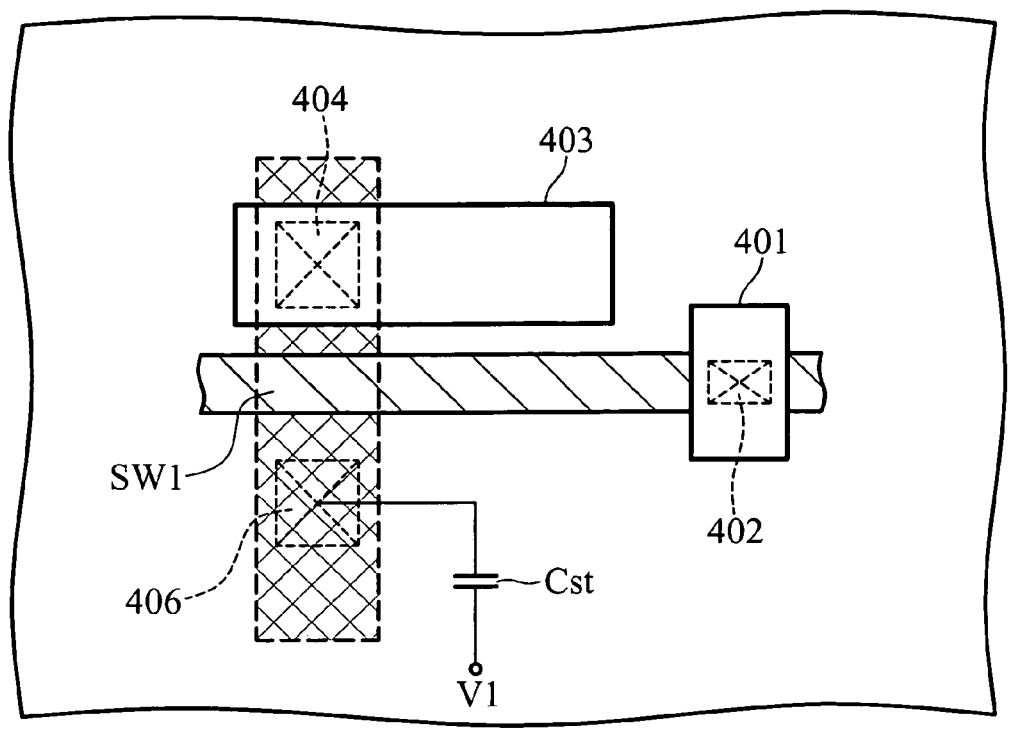
FIGS. 5A~5D are plan views of a layout of a DRAM cell in accordance with one embodiment of the invention.
Figure 5B:
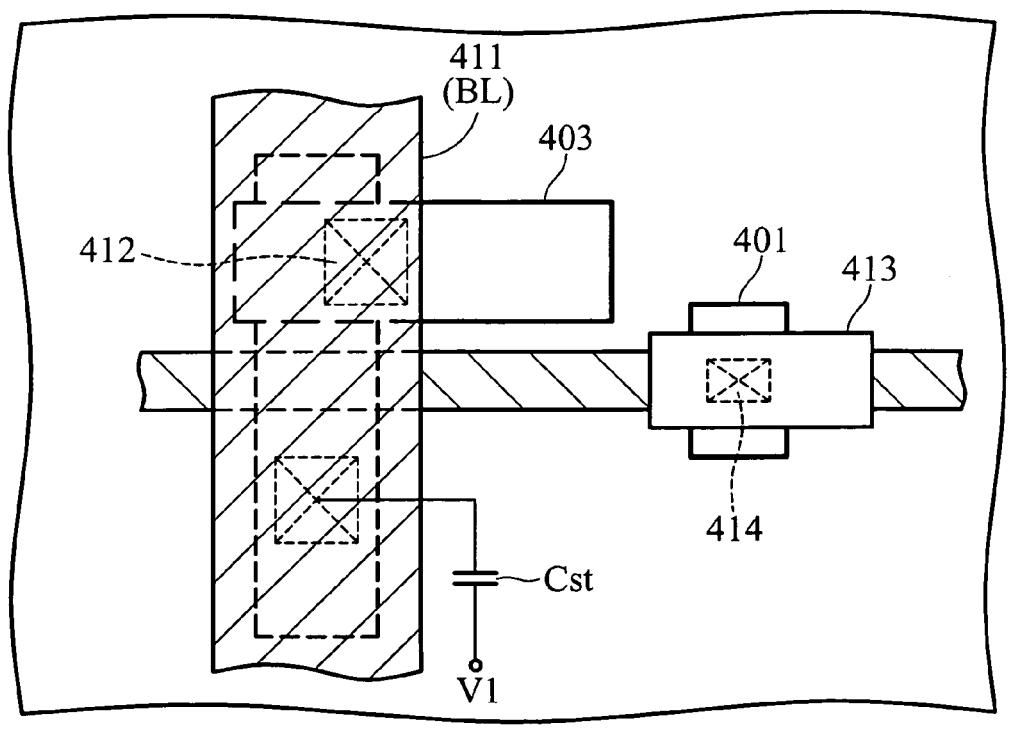
Figure 5C:
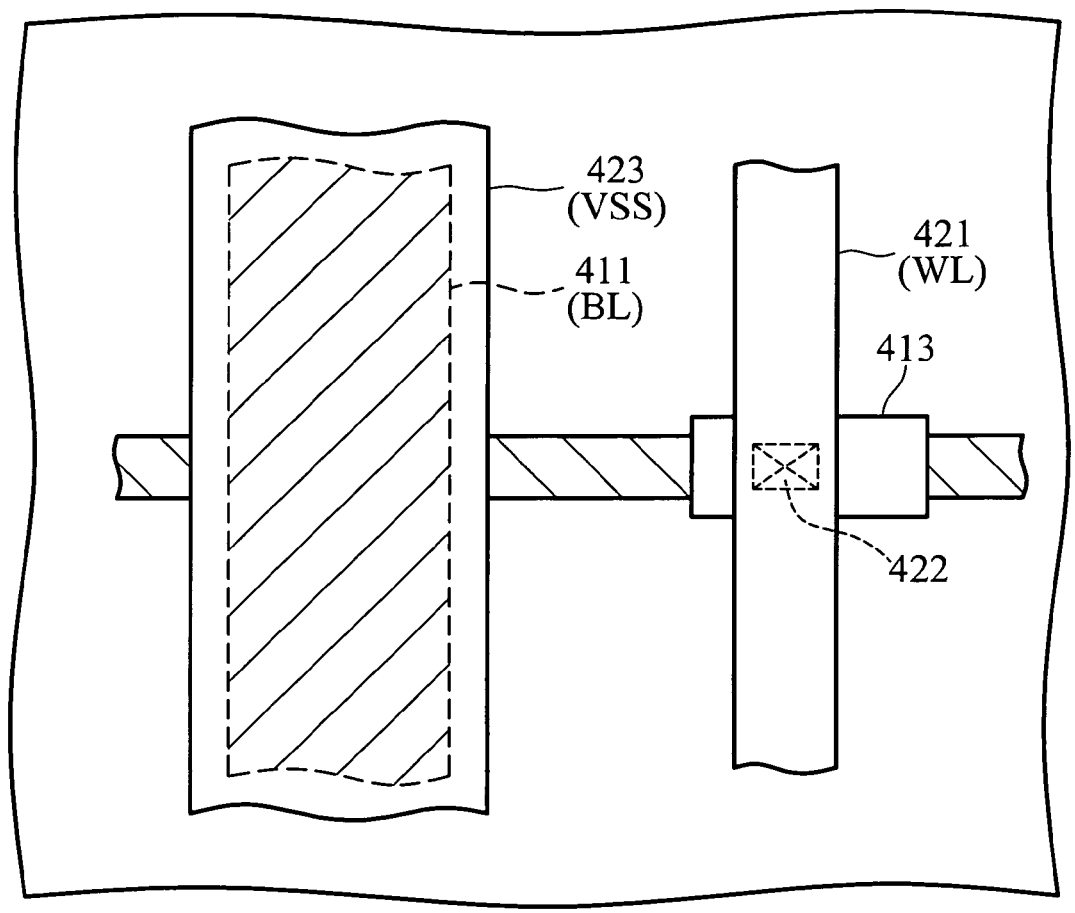
Figure 5D:
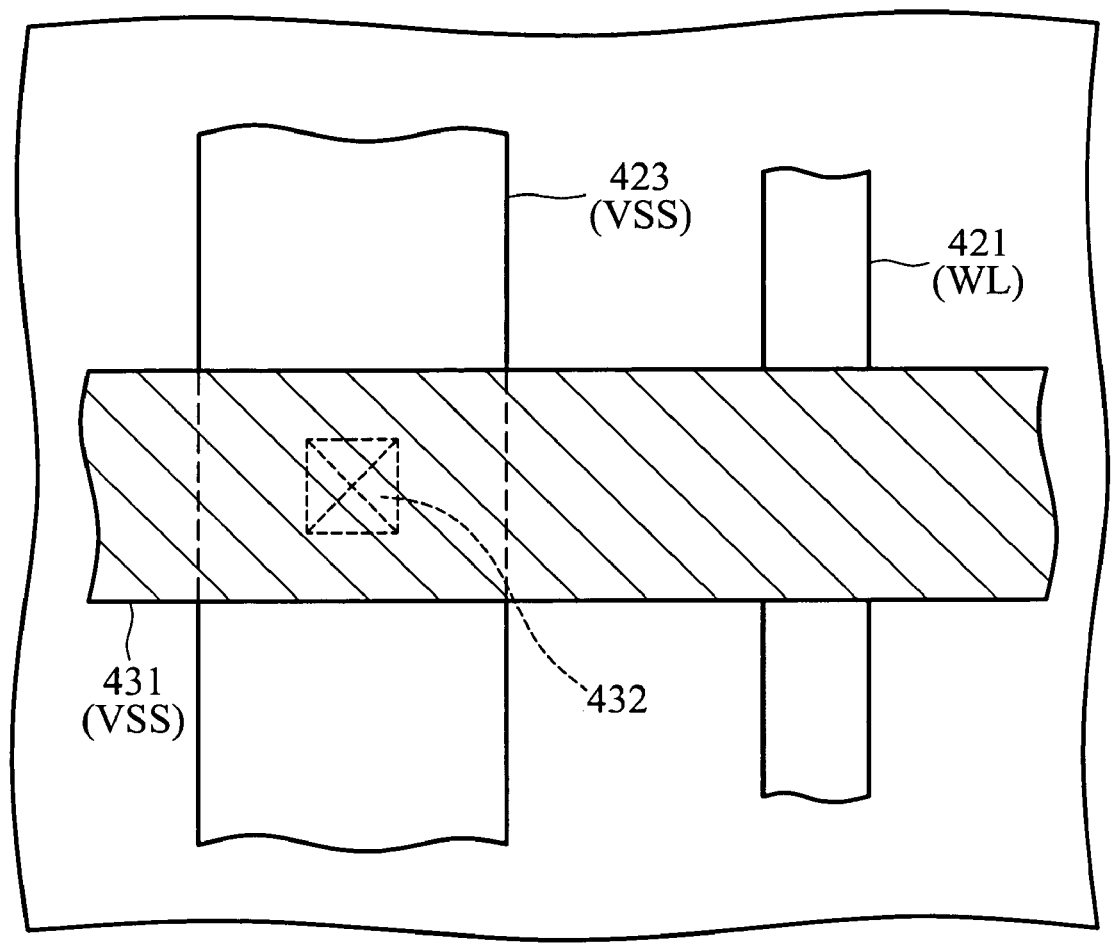

FIGS. 5A~5D are plan views of a layout of a DRAM cell in accordance with one embodiment of the invention. Specifically, FIG. 5A is a plan view combining the semiconductor device (active area and polysilicon) and the first metal layer (M1); FIG. 5B is a plan view comprising the first metal layer (M1) and the second metal layer (M2); FIG. 5C is a plan view comprising the second metal layer (M2) to the third metal layer (M3); and FIG. 5D is a plan view comprising the third metal layer (M3) to the fourth metal layer (M4).

As shown in FIG. 5A, the DRAM cell comprises a switching transistor SW1 formed in a substrate, in which the drain terminal of the switching transistor SW1 is coupled to a storage capacitor, and the source terminal of the switching transistor SW1 is electrically coupled to a bit line BL (not shown) and the gate terminal of the switching transistor SW1 is electrically coupled to a word line WL (not shown). For illustrative purpose, thick-linked rectangles with no fill indicate contact lines formed on the first metal line (M1).

The gate terminal of the switching transistor SW1 is electrically coupled to a contact line 401 via a plug 402, the source terminal of the switching transistor SW1 is electrically coupled to a contact line 403 via a plug 404, and the drain terminal of the switching transistor SW1 is electrically coupled to a storage capacitor Cst, such as a plate capacitor, a trench capacitor, a stack capacitor or the like, via a plug 405.

FIG. 5B is a plan view comprising metal layers M1 and M2 that may be used in conjunction with the memory cell layout illustrated in FIG. 5A. The second metal layer M2 comprises a bit line (BL) 411 and a contact line 413. The bit line 411 is electrically coupled to the contact line 403 on the first metal layer (M1) via a plug 412, and the contact line 403 on M1 is electrically coupled to the source terminal of the switching transistor SW1. The contact line 413 is electrically coupled to the contact line 401 on the first metal layer (M1) via a plug 414, and the contact line 401 on M1 is electrically coupled to the gate terminal of the switching transistor SW1.

FIG. 5C is a plan view comprising metal layers M1, M2 and M3 that may be used in conjunction with the memory cell layout illustrated in FIG. 5B. The third metal layer M3 comprises a word line 421 and a VSS line 423.

The word line 421 is electrically coupled to the contact line 413 on the second metal layer (M2) via a plug 422. The VSS line 423 is electrically coupled to a fixed voltage (not shown), such as VSS, ground, VCC or the like. In this embodiment, the bit line 411 on the second metal layer (M2) is fully covered by the VSS line 423 on the third metal layer (M3). The word line 421 is parallel to the VSS line 423 on M3 and the bit line 411 on M2. In some embodiments, the bit line 411 on the second metal layer (M2) can also be partially covered by the VSS line 423 on the third metal layer (M3).

FIG. 5D is a plan view comprising metal layers M3-M4 that may be used in conjunction with the memory cell layout illustrated in FIG. 5C. The fourth metal layer M4 comprises a VSS line 431. The VSS line 431 is perpendicular to the VSS line 423 and the word line 421 on the third metal layer (M3). The VSS line 431 is electrically coupled to the VSS line 423 on the third metal layer (M3) via a plug 432 to form a power grid.

Because the bit line is fully or partially covered by a VSS line (or VCC line) thereon, the invention prevents noise interference caused by metal layer signal lines on SRAM cell for data commutation and cross-array control lines. Thus, the memory cell of the invention improves noise shielding, and signal line routing through cell array is allowed, thereby improving layout efficiency, chip size and chip speed. In order to maintain a lowest IR drop, VSS lines or VCC lines of the invention are formed as a power grid, thereby obtaining a robust power line and a stable embedded memory chip.

Figure 6:
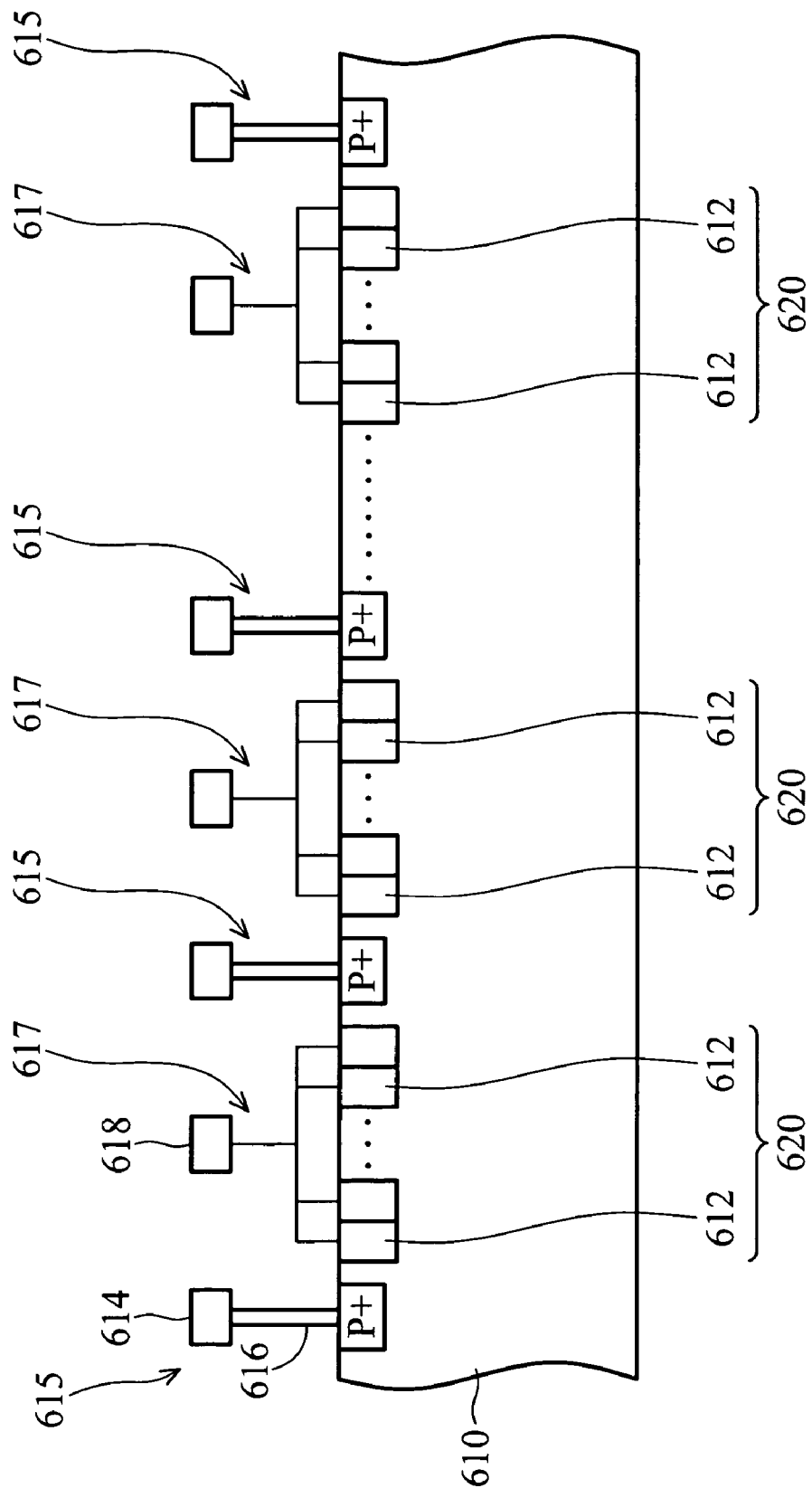
FIG. 6 shows a substrate with memory cell array formed therein.

In the preferred embodiments at least one well strap contact is disposed between each two memory cell arrays. FIG. 6 illustrates this embodiment for illustrative purposes only. A p-type substrate 610 has memory cells 612 formed thereon, each of which can be, for example, a 6T-SRAM or an 8T-SRAM memory cell. Each memory array 620 comprises a plurality of memory cells 612. P-well memory strap cells 615 each comprise a P-well voltage conductive line 614, a P-type doped region in the substrate 610, and plugs 616 electrically coupled therebetween. The P-well voltage conductive lines 614 are formed on one or more of the metal layers, such as M1, M2, M3 or the like, and may be electrically coupled, for example, to ground. N-well memory strap cells 617 each comprise a P-well voltage conductive line 618, an N-type doped region in the N-well of each memory cell 612, and plugs (not shown) electrically coupled therebetween. The N-well voltage conductive lines 618 are formed on one or more of the metal layers, such as M1, M2, M3 or the like, and may be electrically coupled, for example, to VCC.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory cell, comprising:
   a substrate comprising two cross-coupled inverters and first and second pass-gate transistors formed therein, the inverters having a data storage node and a complementary date storage node coupled to first terminals of the first and second pass-gate transistors;
   a bit line and a complementary bit line disposed over the substrate and electrically connected to second terminals of the first and second pass-gate transistors respectively;
   two first power lines covering the bit line and the complementary bit line respectively, wherein longitudinal axes of the first power lines, the bit line and the complementary bit line are parallel to each other; and
   two third power lines, having a longitudinal axis perpendicular to the longitudinal axes of the bit line and the complementary bit line, wherein the third power lines are disposed under the first power lines and the first power lines and the third power lines are electrically connected to a fixed power voltage to form a power grid.

2. The memory cell of claim 1, wherein the two first power lines partially cover the bit line and the complementary bit line.

3. The memory cell of claim 1, wherein the two first power lines fully cover the bit line and the complementary bit line.

4. The memory cell of claim 1, a second power line disposed over the substrate, positioned between the bit line and the complementary bit line, having a longitudinal axis parallel to that of the bit line and the complementary bit line, and electrically connected to first power terminals of the cross-coupled inverters.

5. The memory cell of claim 1, further comprises a word line having a longitudinal axis perpendicular to the longitudinal axes of the bit line and the complementary bit line and electrically connected to gates of the first and second pass-gate transistors.

6. The memory cell of claim 1, further comprising:
   a word line disposed over the substrate, having a longitudinal axis perpendicular to the longitudinal axes of the bit line and the complementary bit line, and electrically connected to gates of the first and second pass-gate transistors; and
   two fourth power lines disposed over the word line, having a longitudinal axis parallel to the longitudinal axes of the bit line and the complementary bit line, and electrically connecting the first power lines to second power terminals of the cross-coupled inverters.

7. A memory cell, comprising:
   a substrate comprising a pass-gate transistor formed therein;
   a bit line disposed over the substrate and electrically connected to a first terminal of the pass-gate transistor;
   a first power line covering the bit line, wherein longitudinal axes of the first power line and the bit line are parallel to each other;
   a second power line disposed on the first power line and having a longitudinal axis perpendicular to the longitudinal axis of the bit line, wherein the first power line and the second power line are electrically connected to a fixed power voltage; and
   a storage capacitor coupled between a constant voltage and a first terminal of the pass-gate transistor.

8. The memory cell of claim 7, wherein the first power line partially covers the bit line.

9. The memory cell of claim 8, wherein the first power line fully covers the bit line.

10. A memory cell, comprising:
a substrate;
a bit line and a complementary bit line disposed over the substrate;
two first power lines covering the bit line and the complementary bit line respectively, wherein longitudinal axes of the first power lines, the bit line and the complementary bit line are parallel to each other; and
two third power lines disposed over the bit line and the complementary bit line, having longitudinal axes perpendicular to the longitudinal axes of the bit line and the complementary bit line, wherein the first power lines and the third power lines are electrically connected to a fixed power voltage to form a power grid.

11. The memory cell of claim 10, wherein the two first power lines partially cover the bit line and the complementary bit line.

12. The memory cell of claim 11, wherein the two first power lines fully cover the bit line and the complementary bit line.

13. The memory cell of claim 10, further comprises a second power line disposed on the substrate and positioned between the bit line and the complementary bit line, and having a longitudinal axis perpendicular to the longitudinal axes of the bit line and the complementary bit line.

14. A semiconductor memory device, comprising:
a plurality of memory arrays each comprising a plurality of memory cells as claimed in claim 1; and
at least one first well strapping cell disposed over the substrate and electrically connected to p-well regions in the memory cells.

15. The semiconductor memory device of claim 14, further comprising at least one second well strapping cell disposed over the substrate and electrically connected to n-well regions in the memory cells.

16. The semiconductor memory device of claim 15, wherein the first well strapping cell is disposed over the substrate and between each two memory arrays, and comprises a p-well voltage conductive line perpendicular to the bit line, and the second well strapping cell is disposed over the substrate and between each two first well strapping cells, and comprises an n-well voltage conductive line perpendicular to the bit line.

* * * * *